(12) United States Patent
Cheng et al.

(10) Patent No.: US 9,240,326 B2
(45) Date of Patent: Jan. 19, 2016

(54) SELF-ALIGNED BORDERLESS CONTACTS USING A PHOTO-PATTERNABLE DIELECTRIC MATERIAL AS A REPLACEMENT CONTACT

(71) Applicant: GLOBALFOUNDRIES INC., Grand Cayman (KY)

(72) Inventors: Szu-lin Cheng, Yorktown Heights, NY (US); Jack O. Chu, Manhasset Hills, NY (US); Isaac Lauer, Yorktown Heights, NY (US); Jeng-bang Yau, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/028,022

(22) Filed: Sep. 16, 2013

(65) Prior Publication Data

US 2014/0312397 A1 Oct. 23, 2014

Related U.S. Application Data

(63) Continuation of application No. 13/867,616, filed on Apr. 22, 2013, now Pat. No. 9,059,095.

(51) Int. Cl.
*H01L 29/76* (2006.01)
*H01L 29/40* (2006.01)
(Continued)

(52) U.S. Cl.
CPC ........ *H01L 21/283* (2013.01); *H01L 21/76877* (2013.01); *H01L 21/76897* (2013.01); *H01L 21/823431* (2013.01); *H01L 21/823475* (2013.01); *H01L 29/41775* (2013.01);
(Continued)

(58) Field of Classification Search
CPC ............. H01L 29/66545; H01L 27/11556; H01L 29/6659; H01L 29/7889; H01L 29/517; H01L 27/11551; H01L 29/78; H01L 27/11582; H01L 29/4908; H01L 21/76897; H01L 21/823842; H01L 29/6656; H01L 29/51
USPC ............... 438/672, 677, 664, 592, 237, 509; 257/774, 769, E21.476, E21.546, 288
See application file for complete search history.

(56) References Cited

U.S. PATENT DOCUMENTS 5,854,097 A 12/1998 Ohmi et al.
6,221,779 B1 4/2001 Dennison et al.
(Continued)

OTHER PUBLICATIONS

Office Action dated Sep. 15, 2014 received in a U.S. Appl. No. 13/867,616.
(Continued)

*Primary Examiner* — Amar Movva
*Assistant Examiner* — Sheikh Maruf
(74) *Attorney, Agent, or Firm* — Scully, Scott, Murphy & Presser, P.C.

(57) ABSTRACT

A photo-patternable dielectric material is provided to a structure which includes a substrate having at least one gate structure. The photo-patternable dielectric material is then patterned forming a plurality of sacrificial contact structures adjacent the at least one gate structure. A planarized middle-of-the-line dielectric material is then provided in which an uppermost surface of each of the sacrificial contact structures is exposed. Each of the exposed sacrificial contact structures is then removed providing contact openings within the planarized middle-of-the-line dielectric material. A conductive metal-containing material is formed within each contact opening.

12 Claims, 7 Drawing Sheets

(51) Int. Cl.
*H01L 23/48* (2006.01)
*H01L 21/283* (2006.01)
*H01L 21/768* (2006.01)
*H01L 29/78* (2006.01)
*H01L 29/417* (2006.01)
*H01L 29/66* (2006.01)
*H01L 21/8234* (2006.01)

(52) U.S. Cl.
CPC ........ *H01L29/41791* (2013.01); *H01L 29/665* (2013.01); *H01L 29/66575* (2013.01); *H01L 29/66795* (2013.01); *H01L 29/785* (2013.01)

(56) References Cited

U.S. PATENT DOCUMENTS

| | | | |
|---|---|---|---|
| 6,342,452 B1 * | 1/2002 | Coronel et al. | 438/710 |
| 6,391,763 B1 | 5/2002 | Liu | |
| 6,437,411 B1 * | 8/2002 | Choi | H01L 21/02071 |
| | | | 257/316 |
| 6,448,175 B1 | 9/2002 | Kobayashi et al. | |
| 6,530,380 B1 | 3/2003 | Zhou et al. | |
| 6,881,688 B2 | 4/2005 | Maile | |
| 7,023,055 B2 | 4/2006 | Ieong et al. | |
| 7,297,360 B2 | 11/2007 | Yoshioka et al. | |
| 7,329,923 B2 | 2/2008 | Doris et al. | |
| 2003/0148581 A1 * | 8/2003 | Kim | H01L 27/10808 |
| | | | 438/253 |
| 2004/0016957 A1 * | 1/2004 | Wu | H01L 27/10811 |
| | | | 257/316 |
| 2005/0116290 A1 | 6/2005 | de Souza et al. | |
| 2006/0148153 A1 * | 7/2006 | Kwon et al. | 438/197 |
| 2006/0148181 A1 | 7/2006 | Chan et al. | |
| 2006/0163642 A1 * | 7/2006 | Widdershoven | G11C 16/0458 |
| | | | 257/315 |
| 2007/0134909 A1 * | 6/2007 | Klee et al. | 438/620 |
| 2008/0233738 A1 * | 9/2008 | Beyer et al. | 438/643 |
| 2010/0038723 A1 * | 2/2010 | Babich | H01L 21/76816 |
| | | | 257/384 |
| 2010/0052018 A1 | 3/2010 | Cohen et al. | |
| 2011/0298061 A1 * | 12/2011 | Siddiqui et al. | 257/410 |
| 2011/0309416 A1 * | 12/2011 | Yamashita | H01L 21/764 |
| | | | 257/288 |
| 2012/0068346 A1 | 3/2012 | Ponoth et al. | |
| 2012/0115330 A1 * | 5/2012 | Mukherjee | H01L 21/28512 |
| | | | 438/675 |
| 2012/0175711 A1 | 7/2012 | Ramachandran et al. | |
| 2012/0187566 A1 * | 7/2012 | Horak | H01L 21/7682 |
| | | | 257/774 |
| 2012/0256238 A1 * | 10/2012 | Ning et al. | 257/280 |
| 2012/0261829 A1 * | 10/2012 | Lin | H01L 21/76814 |
| | | | 257/774 |
| 2013/0113073 A1 * | 5/2013 | Liu et al. | 257/532 |
| 2013/0341704 A1 * | 12/2013 | Rachmady | H01L 29/66545 |
| | | | 257/327 |
| 2014/0147978 A1 * | 5/2014 | Chen et al. | 438/229 |

OTHER PUBLICATIONS

Notice of Allowance dated Feb. 13, 2015 received in related U.S. Appl. No. 13/867,616.

* cited by examiner

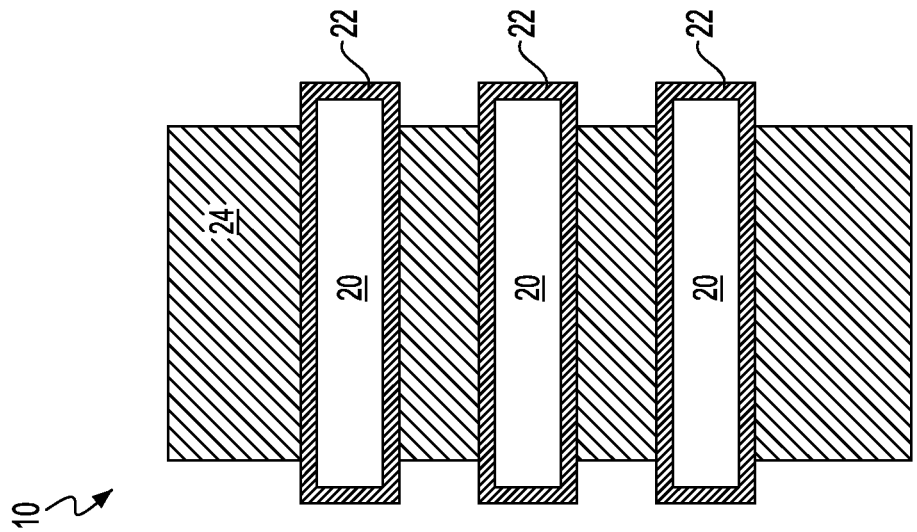
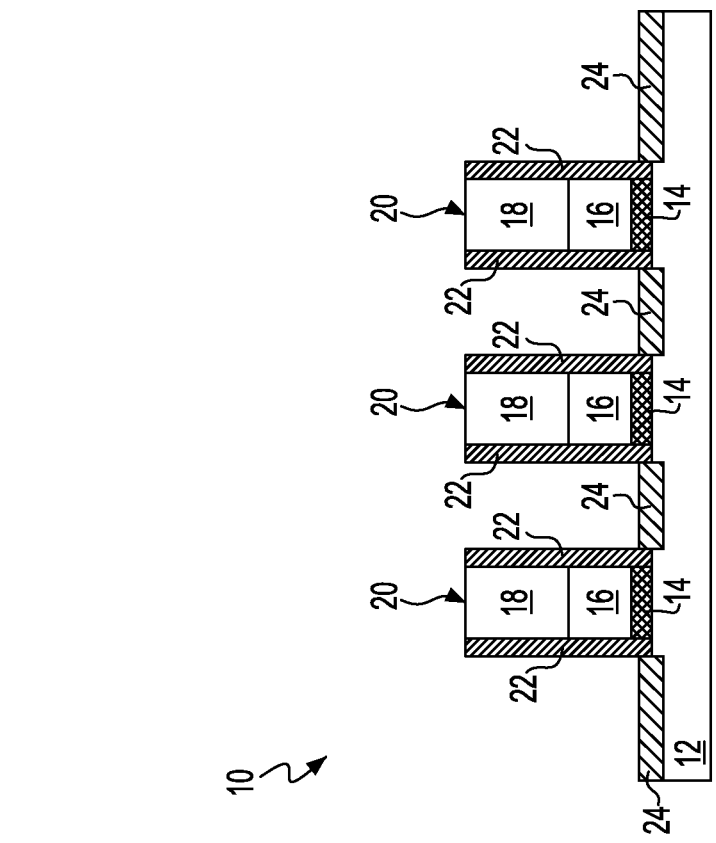

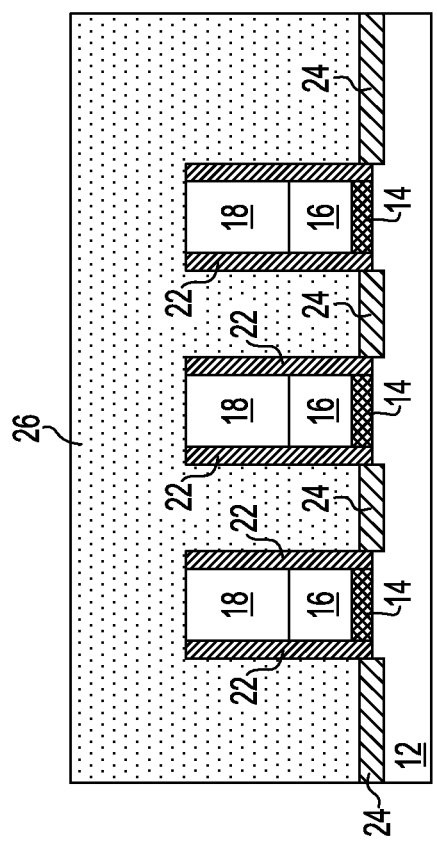
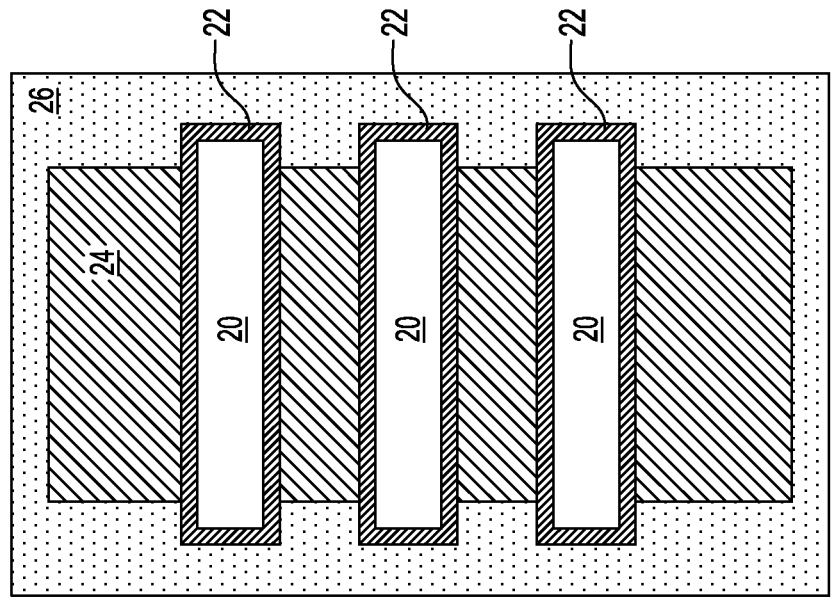
FIG. 2A
FIG. 2B

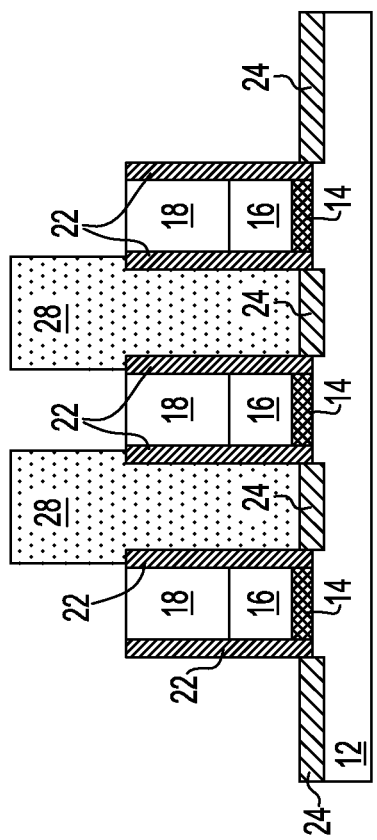
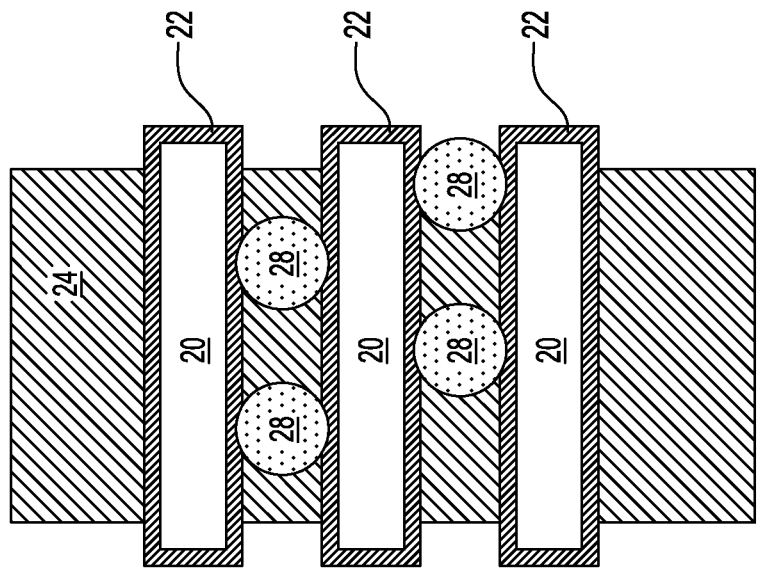
FIG. 3B
FIG. 3A

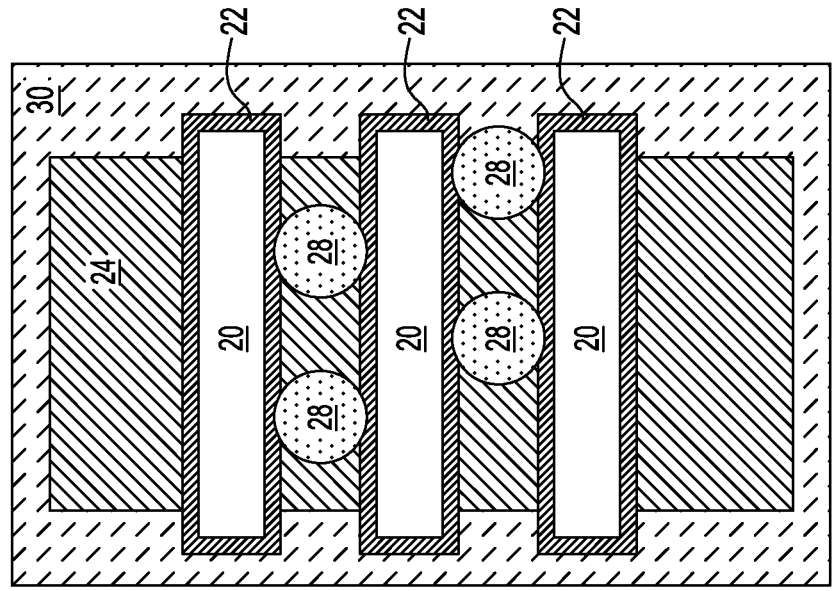
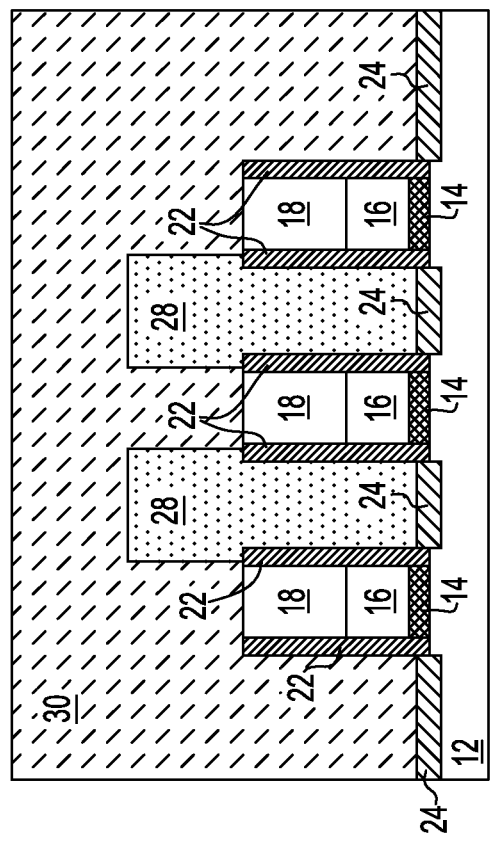
FIG. 4B
FIG. 4A

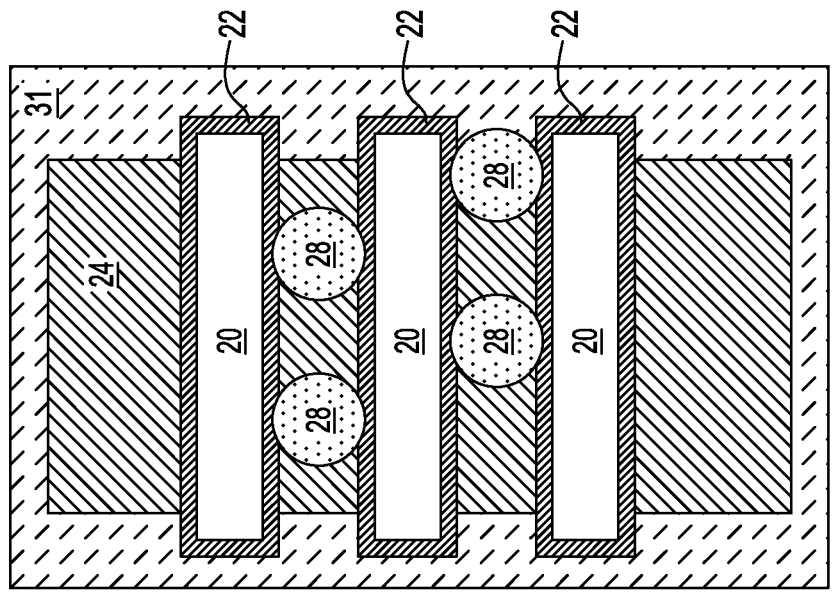
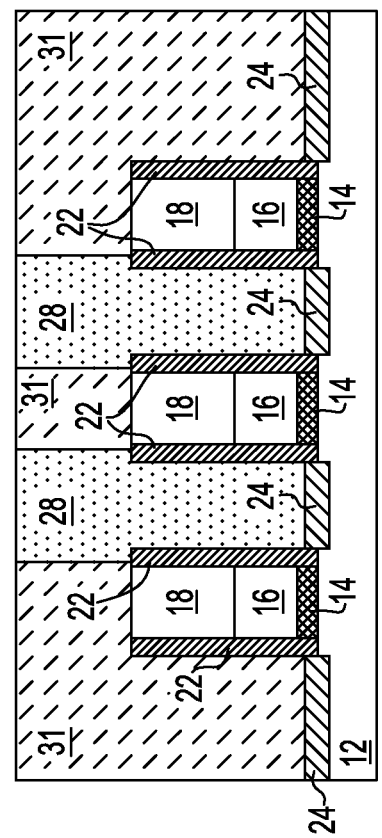
FIG. 5B
FIG. 5A

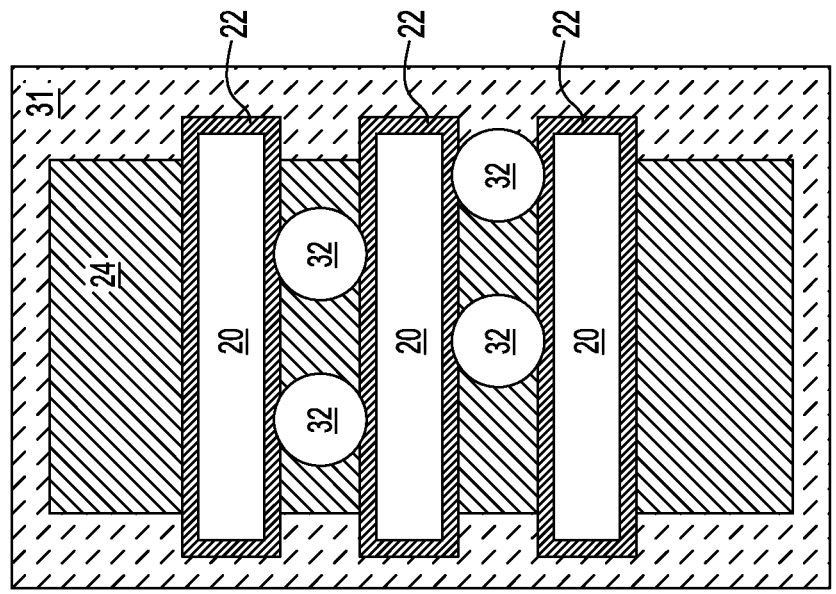
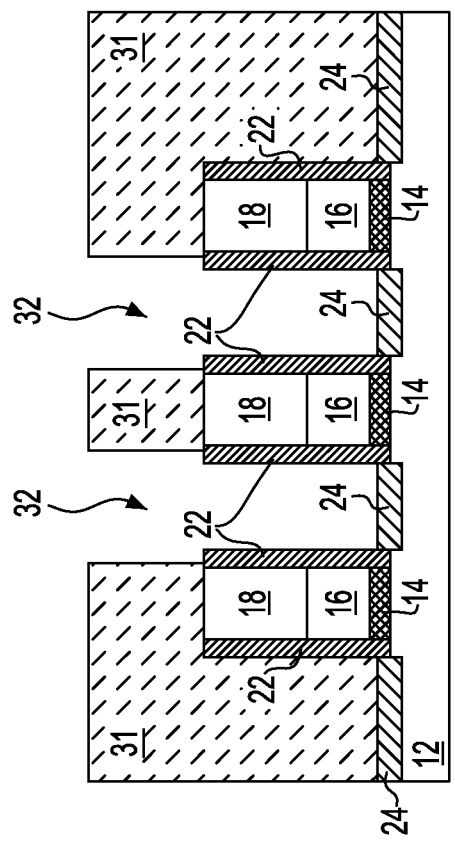
FIG. 6A
FIG. 6B

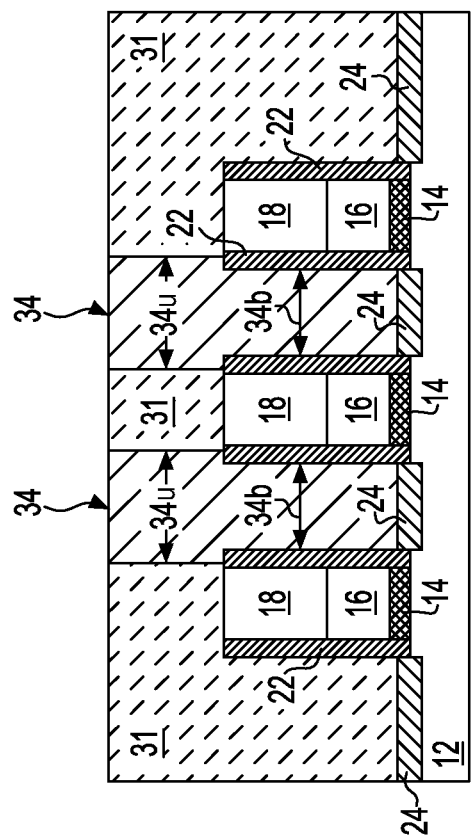
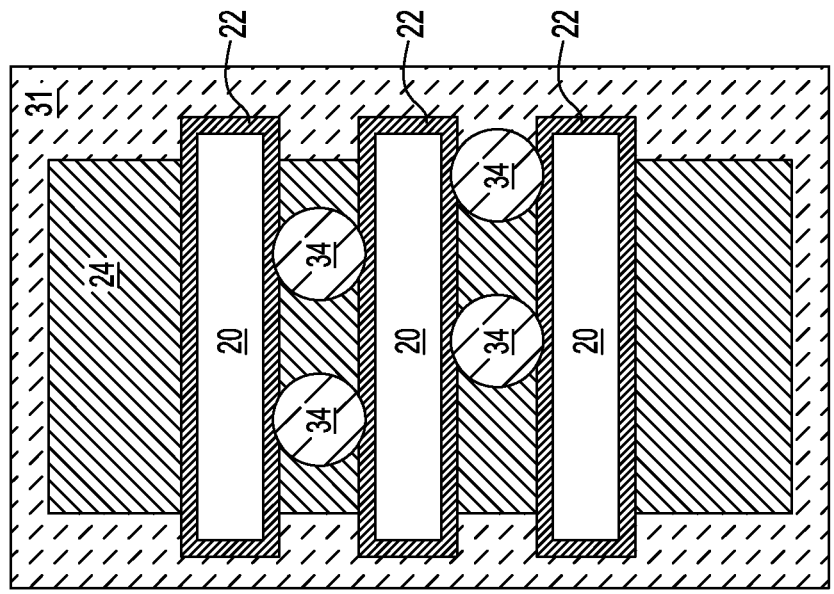
FIG. 7A
FIG. 7B

SELF-ALIGNED BORDERLESS CONTACTS USING A PHOTO-PATTERNABLE DIELECTRIC MATERIAL AS A REPLACEMENT CONTACT

CROSS REFERENCE TO RELATED TO APPLICATION

This application is a continuation of U.S. patent application Ser. No. 13/867,616, filed Apr. 22, 2013 the entire contents and disclosure of which is incorporated herein by reference.

BACKGROUND

The present disclosure relates to a semiconductor structure and a method of fabricating the same. More particularly, the present disclosure relates to a semiconductor structure containing self-aligned borderless contacts and methods of forming the same.

The formation of electrical contacts to electronic and memory devices is a considerable challenge as the integration density of these devices is increased as a consequence of technology scaling. For example, the projected contact pitch for the 32 nm, 22 nm, and 15 nm nodes are 130 nm, 100 nm, and 80 nm, respectively. In order to fit the contact between adjacent gates, contacts must be made at dimensions approaching the gate length of the device unlike previous technologies where the contacts were many times larger than the gate. Definition of this contact is a lithographic challenge. Alignment of the contact to the source, drain, and gate of the device is critical. In particular, misalignment of the source and drain contacts with respect to the gate can cause electrical shorts, rendering the device inoperable.

Therefore a need exists to overcome the problems with the prior art as discussed above.

SUMMARY

A photo-patternable dielectric material is provided to a structure which includes a substrate having at least one gate structure. The photo-patternable dielectric material is then patterned forming a plurality of sacrificial contact structures located adjacent to the at least one gate structure. A planarized middle-of-the-line dielectric material is then provided in which an uppermost surface of each of the sacrificial contact structures is exposed. Each of the exposed sacrificial contact structures is then removed providing contact openings within the planarized middle-of-the-line dielectric material. A conductive metal-containing material is formed within each contact opening.

In one aspect of the present disclosure, a first method of forming a semiconductor structure having at least one self-aligned borderless contact is provided. The first method of the present disclosure includes providing at least one gate stack on a surface of a substrate, wherein metal semiconductor alloy portions are located adjacent to the at least one gate stack. A photo-patternable dielectric material is formed on the at least one gate stack, the metal semiconductor alloy portions and exposed portions of the substrate. The photo-patternable dielectric material is then patterned by employing a direct pattern-wise exposure step to provide a sacrificial contact structure located on a surface of at least one of the metal semiconductor alloy portions. A planarized middle-of-the-line dielectric material is then formed, wherein an uppermost surface of the sacrificial contact structure is exposed. The exposed sacrificial contact structure is removed providing a contact opening, and then the contact opening is filled with a conductive metal-containing material. In accordance with the present disclosure, the conductive metal-containing material provides a metal contact.

The present disclosure also provides a second method of forming a semiconductor structure having at least one self-aligned borderless contact is provided. The second method of the present disclosure includes providing at least one gate stack on a surface of a substrate. A photo-patternable dielectric material is formed on the at least one gate stack and exposed portions of the substrate. The photo-patternable dielectric material is then patterned by employing a direct pattern-wise exposure step to provide a sacrificial contact structure located on an exposed surface of the substrate. A planarized middle-of-the-line dielectric material is then formed, wherein an uppermost surface of the sacrificial contact structure is exposed. The exposed sacrificial contact structure is removed providing a contact opening that exposes a surface of the semiconductor structure on each side of the least one gate stack. The exposed surfaces of the semiconductor substrate are converted into a metal semiconductor alloy portion. The remaining portion of the contact opening is then filled with a conductive metal-containing material. In accordance with the present disclosure, the conductive metal-containing material provides a metal contact.

In another aspect of the present disclosure, a semiconductor structure having at least one self-aligned borderless contact is provided. The semiconductor structure of the present disclosure includes at least one gate structure located on a surface of a substrate, wherein metal semiconductor alloy portions are located adjacent to the at least one gate structure. A middle-of-the-line dielectric material is located on at least exposed portions of the substrate and atop the at least one gate stack. The middle-of-the-line dielectric material includes at least one conductive metal contact that has a bottom contact portion having a bottommost surface in contact with a surface of at least one of the metal semiconductor alloy portions, and an upper contact portion having a portion that partially extends above an uppermost surface of a spacer that is present on a vertical sidewall of the at least one gate structure.

BRIEF DESCRIPTION OF THE DRAWINGS

FIG. 1A is a cross sectional view of a structure including a plurality of gate structures located on a surface of a substrate, wherein metal semiconductor alloy portions are located adjacent in each gate structure that can be employed in one embodiment of the present disclosure.

FIG. 1B is a top-down view of the structure shown in FIG. 1A.

FIG. 2A is a cross sectional view of the structure shown in FIG. 1A after formation of a photo-patternable dielectric material.

FIG. 2B is a top-down view of the structure shown in FIG. 2A.

FIG. 3A is a cross sectional view of the structure shown in FIG. 2A after forming sacrificial contact structures by subjecting the photo-patternable dielectric material to a direct pattern-wise exposure step.

FIG. 3B is a top-down view of the structure shown in FIG. 3A.

FIG. 4A is a cross sectional view of the structure shown in FIG. 4A after formation of a middle-of-the line (MOL) dielectric material.

FIG. 4B is a top-down view of the structure shown in FIG. 4A.

FIG. 5A is a cross sectional view of the structure shown in FIG. 4A after planarizing the MOL dielectric material to expose an uppermost surface of each sacrificial contact structure.

FIG. 5B is a top-down view of the structure shown in FIG. 5A.

FIG. 6A is a cross sectional view of the structure shown in FIG. 5A after removing each sacrificial contact structure and providing contact openings in the planarized MOL dielectric material.

FIG. 6B is a top-down view of the structure shown in FIG. 6A.

FIG. 7A is a cross sectional view of the structure shown in FIG. 6A after filling each of the contact openings with a conductive metal-containing material.

FIG. 7B is a top-down view of the structure shown in FIG. 7A.

DESCRIPTION

The present disclosure will now be described in greater detail by referring to the following discussion and drawings that accompany the present application. It is noted that the drawings of the present application are provided for illustrative purposes and, as such, they are not drawn to scale. In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The present disclosure provides methods of forming self-aligned borderless contacts in which a photo-patternable dielectric material is used as a sacrificial contact. The photo-patternable dielectric material can be directly patterned, without the need of using an overlying photoresist material. By using a photo-patternable dielectric material as a sacrificial contact, the conventional pattern transfer issue, including profile shape and dimension/proximity control, can now be avoided. Also, without invoking a pattern transfer process which is required in prior art processes, the contact profile can now by controlled and defined by the shape of the sacrificial contact, which can be made to have nearly vertical sidewalls. This allows for better metal fill within a contact opening that is formed after the sacrificial contact of the present disclosure is removed.

The methods of the present disclosure will now be described in greater detail by referring to an embodiment in which a planar gate structure is employed. Although the following description describes and illustrates a planar gate structure, the present disclosure can also be used in forming self-aligned borderless metal contacts in non-planar semiconductor devices such as, for example, finFET, and gate-all around semiconductor nanowire transistors. In such embodiments, conventional processing can be used in forming the non-planar gate structures (in lieu of forming the planar gate structure as described and illustrated in FIGS. 1A-1B) and then self-aligned borderless contacts can be formed as described and illustrated in FIGS. 2A-7B of the present disclosure. It is noted that in some of the top down views elements located beneath an uppermost material layer are shown for illustrative purposes only.

Referring now to FIGS. 1A-1B, there are illustrated a structure 10 that can be employed in one embodiment of the present disclosure. The structure 10 includes a plurality of gate structures 20 located on a surface of a substrate 12. Although a plurality of gate structures 20 are described and illustrated, the method of the present disclosure works equally well when only a single gate structure is formed on the uppermost surface of the substrate 12. In one embodiment of the present disclosure, a semiconductor material portion of the substrate 12 that is located directly beneath each gate structure 20 can be referred to herein as a channel portion of the device.

In some embodiments of the present disclosure, the substrate 12 is a bulk semiconductor substrate. When a bulk semiconductor substrate is employed as substrate 12, the bulk semiconductor substrate can be comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the substrate 12 comprises a single crystalline semiconductor material, such as, for example, single crystalline silicon. In other embodiments, the substrate 12 may comprise a polycrystalline or amorphous semiconductor material.

In another embodiment, a semiconductor-on-insulator (SOI) substrate (not specifically shown) is employed as the substrate 12. When employed, the SOI substrate includes a handle substrate, a buried insulating layer located on an upper surface of the handle substrate, and a semiconductor layer located on an upper surface of the buried insulating layer. In some embodiments, particularly when non-planar devices are being fabricated, the semiconductor layer of the SOI substrate can be processed into an active device region such as, for example, a semiconductor fin or a semiconductor nanowire. In such an instance, substrate 12 can thus be composed of the buried insulator and the handle substrate.

The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of silicon. In another embodiment, hybrid SOI substrates are employed which have different surface regions of different crystallographic orientations.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present disclosure. The handle substrate and/or the semiconductor layer of the SOI substrate may be a single crystalline semiconductor material, a polycrystalline material, or an amorphous material. Typically, at least the semiconductor layer is a single crystalline semiconductor material.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 200 Å to 500 Å being more typical. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulating layer of the SOI substrate typically has a thickness from 10 Å to 2000 Å, with a thickness from 1000 Å to 1500 Å being more typical. The thickness of the handle substrate of the SOI substrate is inconsequential to the present disclosure.

In some other embodiments, hybrid semiconductor substrates which have different surface regions of different crystallographic orientations can be employed as substrate 12. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

When a semiconductor material is employed as substrate 12, the semiconductor material 12 may be doped, undoped or contain doped and undoped regions therein. For clarity, the doped regions are not specifically shown in the drawings of the present application. Each doped region within the semiconductor material may have the same, or they may have different conductivities and/or doping concentrations. The doped regions that are present in the semiconductor material of substrate 12 are typically referred to as well regions and they are formed utilizing a conventional ion implantation process or gas phase doping.

The substrate 12 can be processed to include at least one isolation region therein. For clarity, the at least one isolation region is not shown in the drawings of the present disclosure. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region provides isolation between neighboring gate structure regions, typically required when the neighboring gates have opposite conductivities, i.e., nFETs and pFETs. As such, the at least one isolation region separates an nFET device region from a pFET device region.

As stated above, the structure 10 also includes a plurality of gate structures 20 located on a surface of substrate 12. In some embodiments of the present disclosure, each gate structure 20 may have a same conductivity, i.e., nFETs or pFETs. In another embodiment, a first set of gate structures 20 may have a first conductivity, i.e., nFETs or pFETs, and a second set of gate structures 20 may have a second conductivity which is opposite from the first conductivity (i.e., nFETs or pFETs not present in the first set).

Each gate structure 20 can include a material stack of, from bottom to top, a gate dielectric layer portion 14, a gate conductor layer portion 16, and an optional hard mask material layer portion 18. In some embodiments, the optional hard mask material layer portion 18 can be omitted. Each gate structure 20 may contain other materials including but not limited to work function adjusting materials.

The gate dielectric layer portion 14 of each gate structure 20 can be composed of a dielectric material such as, for example, silicon oxide, silicon nitride, silicon oxynitride, a dielectric metal oxide or any multilayered stack thereof. Exemplary dielectric metal oxides that can be employed in the present disclosure as the gate dielectric layer portion 14 include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The dielectric metal oxides typically have a dielectric constant that is greater than that of silicon oxide. The thickness of the gate dielectric layer portion 14 can be from 1 nm to 20 nm. Other thicknesses that are lesser than or greater than the aforementioned range for the gate dielectric layer portion 14 can also be employed in the present disclosure. In some embodiments, each gate structure 20 includes a same gate dielectric layer portion 14. In other embodiments, a first set of gate structures can comprise a first gate dielectric layer portion, while a second set of gate structures can comprised a second gate dielectric layer portion, wherein said second gate dielectric layer portion comprises at least one different gate dielectric material than the first gate dielectric layer portion.

The gate conductor layer portion 16 of each gate structure 20 can be composed of a conductive material including, for example, doped polysilicon, a doped silicon germanium alloy, an elemental metal, an alloy containing at least two elemental metals, a metal semiconductor alloy and any multilayered combination thereof. The thickness of the gate conductor layer portion 16 can be from 50 nm to 150 nm. Other thicknesses that are lesser than or greater than the aforementioned range for the gate conductor layer portion 16 can also be employed in the present disclosure. In some embodiments, each gate structure 20 includes a same gate conductor layer portion 16. In other embodiments, a first set of gate structures can comprise a first gate conductor layer portion, while a second set of gate structures can comprise a second gate conductor layer portion, wherein the second gate conductor layer portion comprises at least one different gate conductor material than the first gate conductor layer portion.

If present, the hard mask material layer portion 18 can be comprised of a dielectric material including, for example, silicon oxide, silicon nitride, silicon oxynitride, boron nitride, silicon boron nitride or multilayered stacks thereof. When present, the thickness of the hard mask material layer portion 18 can be from 20 nm to 100 nm. Other thicknesses that are lesser than or greater than the aforementioned range for the hard mask material layer portion 18 can also be employed in the present disclosure.

The gate structures 20 can be formed utilizing any technique known in the art. For example, and in one embodiment, the gate structures 20 can be formed by blanket depositing various material layers, and then patterning those material layers by lithography and etching. In another embodiment, the gate structures 20 can be formed utilizing a replacement gate process in which a sacrificial gate region is first formed upon the semiconductor substrate and then subsequently replaced with various material layers present within each gate structure 20.

The structure 10 shown in FIGS. 1A-1B also includes a spacer 22 having a first edge located on a vertical sidewall of each gate structure 20 and a base that is located on the surface of substrate 12. The spacer 22 can be composed of a dielectric insulating material such as, for example, silicon oxide, silicon nitride, silicon oxynitride, boron nitride, and/or silicon boron nitride. In some embodiments, the spacer 22 can be composed of a same material as that of the hard mask layer portion 18. In other embodiments, the spacer 22 can be composed of a different material as that of the hard mask material layer portion 18. The spacer 22 can be formed by deposition and etching. In some embodiments, the spacer 22 can be formed after formation of each gate structure 20. In other embodiments, and typically when a replacement gate structure is employed, the spacer 22 can be formed prior to formation of each gate structure 20. The thickness of the spacer, as measured from its base, can be from 1 nm to 10 nm. Other thicknesses that are lesser than or greater than the aforementioned range for the spacer 22 can also be employed in the present disclosure.

In some embodiments of the present disclosure, the pitch of the gate structures, i.e., the distance from a central portion of one gate structure to a central portion of its nearest neighboring gate structure, is from 55 nm or less.

In some embodiment, the structure 10 shown in FIGS. 1A-1B also includes metal semiconductor alloy portions 24 that are located adjacent in each gate structure 20. In some embodiments, the metal semiconductor alloy portions 24 are located within a semiconductor material portion of the substrate 12 which includes source/drain diffusion regions (not separately labeled) therein. In such an embodiment, the source/drain diffusion regions can be formed into a predetermined semiconductor material portion of substrate 12 utilizing ion implantation. An anneal can follow the ion implant step to active the ion implanted dopant atoms. After formation of the source/drain diffusion regions, the metal semiconductor alloy portions 24 can be formed. In one embodiment, the metal semiconductor alloy portions 24 can be formed utilizing a salicidation (silicidation) and/or germanidation process. When a salicidation process is employed, the metal semiconductor alloy portion can be referred to as a metal silicide portion. When a germanidation process is employed, the metal semiconductor alloy portion may be referred to as a metal germanide. Both metal semiconductor alloy formation processes include forming a metal capable of reacting with a semiconductor material portion of the substrate 12, forming a barrier layer atop the metal, heating the structure to form a metal semiconductor alloy, removing non-reacted metal and the barrier layer and, if needed, conducting a second heating step. The second heating step is required in those instances in which the first heating step does not form the lowest resistance phase of the metal semiconductor alloy. In the event no semiconductor material is present, or if an additional thickness of semiconductor material is needed, a layer of semiconductor material can be formed by epitaxial growth. The metal used in forming the metal semiconductor alloy comprises one of Ti, Ni, Pt, W, Co, Ir, and the like. Alloying additives can also be present as desired. The barrier layer is typically comprised of TiN or TaN. In other embodiments of the present disclosure, the metal semiconductor alloy portions are not formed at this point of the present disclosure, but instead are formed after forming the contact opening and prior to filling the contact opening with a conductive metal-containing material.

The heating, i.e., anneal, step used in forming the metal semiconductor alloy portions 24 includes conditions that are well known to those skilled in the art. In one embodiment, the first heating step can be performed at a temperature from 700° C. to 900° C., with a temperature from 800° C. to 850° C. being even more typical (especially when a $TiSi_2$ is formed). In another embodiment and when NiSi is to be formed, the first heating step can be performed at temperature from 300° C. to 400° C. The second heating step, if performed, is typically performed at a temperature from 400° C. to 500° C. In embodiments in which a hard mask is not present atop the gate conductor, the above steps may also form a metal semiconductor alloy on top of each exposed gate conductor layer portion 16. In yet other embodiments, the above processing steps may completely remove exposed conductor gate layer portions and replace the same with a fully silicided gate conductor layer portion.

Referring now to FIGS. 2A-2B, there are illustrated the structure shown in FIGS. 1A-1B after formation of a photo-patternable dielectric material 26. It is noted that the in the top-down view the gate structures 20 and semiconductor alloy portions 24 are shown for illustrated proposes only. As shown, the photo-patternable dielectric material 26 covers the entirety of the surfaces shown in FIGS. 1A-1B. The photo-patternable dielectric material 26 that is employed in the present disclosure functions as a photoresist material itself and as such during a subsequent lithographic patterning process, no separate photoresist material or subsequent pattern transfer etch is required to pattern the photo-patternable dielectric material 26.

In one embodiment of the present disclosure, the photo-patternable dielectric material 26 includes a functionalized polymer, copolymer or blend including at least two of any combination of polymers and/or copolymers having one or more acid-sensitive imageable groups. In embodiments in which photo-patternable dielectric material 26 is comprised of a polymer, the polymer includes at least one monomer. When the photo-patternable dielectric material 26 is comprised of a copolymer, the copolymer includes at least two monomers. The blends of polymers and/or copolymers include at least two of any combination of polymers and/or copolymers described below.

In some embodiments of the present disclosure, the photo-patternable dielectric material 26 comprises a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltri-alkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

In other embodiments, the photo-patternable dielectric material 26 comprises a photo/acid-sensitive polymer of one monomer or a copolymer of at least two monomers selected from siloxane, silane, carbosilane, oxycarbosilane, organosilicates, silsesquioxanes and the like. In further embodiments, the photo-patternable dielectric material 26 may comprising a polymer of one monomer or a copolymer of at least two monomers selected from alkyltrialkoxysilane, tetraalkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the photo-patternable dielectric material 26 may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetraalkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Illustrative polymers for the photo-patternable dielectric material 26 include, but are not limited to, siloxane, silane, carbosilane, oxycarbosilane, silsesquioxane-type polymers including caged, linear, branched or combinations thereof. In one embodiment, the photo-patternable dielectric material 26 comprises hydrogen silsesquioxane.

The photo-patternable dielectric material 26 is formed from a patternable composition (negative-tone or positive-tone) that includes at least one of the above mentioned polymers, copolymers or blends, a photoacid generator, a base additive and a solvent typically used in a photoresist composition. When the photo-patternable dielectric material is a negative-tone patternable material, it may be formed from a patternable composition optionally including an additional cross-linker.

When the photo-patternable dielectric material 26 is a positive-tone patternable material, it is formed from a patternable composition that includes at least one of the above mentioned polymers, copolymers or blends, a photoacid generator, a base additive and a solvent typically used in a photoresist. The photoacid generators, base additives and solvents are well known to those skilled in the art and, as such, details regarding those components are not fully provided.

The photo-patternable dielectric material 26 can be formed by a deposition process including, for example, spin-on-coating, dip coating, brush coating, blade coating, chemical solution deposition, and ink-jet dispensing. After depositing the photo-patternable dielectric material 26, a post deposition baking step is typically, but not necessarily always, employed to remove unwanted components, such as solvent. When performed, the baking step can be conducted at a temperature from 40° C. to 200° C. In one embodiment, the photo-patternable dielectric material 26 can have a thickness from 80 nm to 500 nm. Other thicknesses that are greater or lesser than the range provided above can also be used for the photo-patternable dielectric material 26.

Referring now to FIGS. 3A-3B, there are illustrated the structure shown in FIGS. 2A-2B after forming sacrificial contact structures 28 by directly patterning the photo-patternable dielectric material 26. Each sacrificial contact structure 28 is comprised of the photo-patternable dielectric material mentioned above. As shown in FIGS. 3A-3B, each sacrificial contact structure 28 that is formed has a bottommost surface in contact with an uppermost surface of the metal semiconductor alloy portions 24 and an uppermost surface that extends above the uppermost surface of the gate structures 20. In some embodiments, each sacrificial contact structure 28 that is formed has an upper portion that extends partially above spacer 22.

Specifically, the photo-patternable dielectric material 26 can be patterned by subjecting the same to a pattern-wise exposure step that forms latent images of a desired pattern. The desired pattern may be in the shape of a circular rod, a square, and a rectangular. Other shapes as possible and are thus not excluded from being formed in the present disclosure. In some embodiments, an optional post-exposure baking may be required to effect the photochemical reactions. When performed, the optional post-exposure baking step can be conducted at a temperature from 60° C. to 200° C. After exposure and post-exposure baking, the latent images are developed directly into the photo-patternable dielectric material 26 with an appropriate developer, usually an aqueous base solution, such as 0.26N tetramethylammoniahydroxide (TMAH) solution, to form sacrificial contact structures 28 having the desired pattern.

The pattern wise exposing process can be accomplished in a variety of ways, including, for example, through a mask with a lithography stepper or a scanner with an exposure light source of G-line, M-line (365 nm), DUV (248 nm, 193 nm, 157 nm, 126 nm), Extreme UV (13.4 nm), an electron beam, or an ion beam. The exposing process may be performed in a dry mode or an immersion mode. The pattern-wise exposing process also includes direct writing without the use of a mask with, for example, light, electron beam, ion beam, and scanning probe lithography. Other patterning techniques that can be used include contact printing techniques such as nanoimprint lithography, embroising, micro contact printing, replica molding, microtransfer molding, micromolding in capillaries and solvent-assisted micromolding, thermal assisted embroising, inject printing, and the like.

Referring now to FIGS. 4A-4B, there are illustrated the structure shown in FIGS. 3A-3B after formation of a middle-of-the line (MOL) dielectric material 30. In the illustrated embodiment, the MOL dielectric material 30 is located on all surfaces of the structure shown in FIGS. 3A-3B.

In one embodiment of the present disclosure, the MOL dielectric material 30 can be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present disclosure denotes a dielectric material that has a dielectric constant of less than silicon dioxide. In some embodiments, dielectrics containing carbon are used as the MOL dielectric material. Other types of dielectrics can be used as the MOL dielectric as long as there exists an etch contrast between the sacrificial contact structures 28 and the MOL dielectric material 30.

The MOL dielectric material 30 can be formed utilizing a conventional deposition process including, for example, chemical vapor deposition (CVD), plasma enhanced chemical vapor deposition (PECVD), evaporation and spin-on coating. The thickness of the MOL dielectric material 30 that can be employed in the present disclosure may vary depending on the type of MOL dielectric employed as well as the method that was employed in forming the same. In one embodiment, the MOL dielectric material 30 has a thickness from 80 nm to 500 nm. Other thicknesses that are greater or lesser than the range provided above can also be used for the MOL dielectric material 30.

In one embodiment of the present disclosure, planarization can be achieved utilizing a chemical mechanical polishing process. In another embodiment, a self-planarizing material such as a spin-on glass (SOG) or a spin-on low-k dielectric material such as SiLK™ can be used as the MOL dielectric 30. The use of a self-planarizing dielectric material as MOL dielectric material 30 may avoid the need to perform a subsequent planarization process.

In one embodiment of the present disclosure, revealing, i.e., exposing, of the sacrificial contact can be done along with the planarization step using chemical mechanical polishing. In another embodiment of the present disclosure, the revealing can be achieved by an etch back step after planarization from either chemical mechanical polishing or applying self-planarizing materials.

Referring now to FIGS. 5A-5B, there are illustrated the structure shown in FIGS. 4A-4B after planarizing the MOL dielectric material 30 and exposing an uppermost surface of each sacrificial contact structure 28. In the drawings, reference numeral 31 denotes the planarized MOL dielectric material. As shown, the uppermost surface of the planarized MOL dielectric material 31 is coplanar with the uppermost surface of each of the sacrificial contact structures 28.

Referring now to FIGS. 6A-6B, there are illustrated the structure shown in FIGS. 5A-5B after removing each sacrificial contact structure 28 and providing contact openings 32 in the planarized MOL dielectric material 31. As shown, each contact opening 32 has an upper portion that partially extends above an uppermost surface of spacer 22 that is present on a vertical sidewall of the at least one gate structure 20. Also, the upper portion of each contact openings has substantially vertical sidewalls defined by sidewall surfaces of the planarized MOL dielectric material 31, and a bottom portion that also has substantially vertical sidewalls defined by sidewall surfaces of spacer 22. By "substantially vertical sidewalls" is meant that the sidewalls of the contact openings 32 are within ±2°, more typically ±0.5°, from 90°. It is also noted that the shape of each of the contact openings 32 that is formed mimics the shape of the sacrificial contact structure.

In one embodiment of the present disclosure, the removal of each sacrificial contact structure 28 can be achieved utilizing a dry etching process including, for example, reaction ion etching, plasma etching, or ion bean etching. In another embodiment of the present disclosure, the removal of each sacrificial contact structure 28 can be achieved utilizing a wet etch process. In one example, HF can be used as a chemical etch during a wet etch process. Other types of etchants such as, for example, a BOE etch which includes a mixture of HF and ammonium hydroxide can be used.

In some embodiments, and if not previously formed, the metal semiconductor alloy portions 24 can be formed on exposed surface portions of the substrate 12 using the remaining portions of the MOL dielectric material 30 as a mask. In such an embodiment, the metal semiconductor alloy portions can be formed utilizing one of the techniques mentioned above.

Referring to FIGS. 7A-7B, there are illustrated the structure shown in FIGS. 6A-6B after filling each of the contact openings 32 with a conductive metal-containing material.

The conductive metal-containing material that can be employed in the present disclosure includes for example, a conductive metal, an alloy comprising at least two conductive metal, a metal silicide or any combination thereof. In one embodiment, the conductive metal-containing material comprises a conductive metal. Illustrative examples of conductive metals that can be employed as the conductive metal-containing material include, for example Cu, W or Al. In one embodiment, the conductive metal-containing material contains W.

The conductive metal-containing material can be formed utilizing a deposition process such as, for example, chemical vapor deposition (CVD), plasma enhanced chemical vapor deposition (PECVD), atomic layer deposition (ALD), plasma enhanced ALD, sputtering, chemical solution deposition or plating (electro or electroless). In one embodiment, and when the conductive metal-containing material contains W, CVD or PECVD is used in forming W within each contact opening.

In some embodiments of the present disclosure, a planarization process such as, for example, chemical mechanical polishing and/or grinding can be used to remove any conductive metal-containing material that forms outside of the contact openings 32 and atop the planarized MOL dielectric material 31. In other embodiments of the present disclosure, a metal etch back process can be used to remove the conductive metals that form outside the contact openings 32.

The conductive metal-containing material that remains in the contact openings 32 provides a conductive metal contact 34 that has a bottom contact portion 34b having a bottommost surface in contact with a surface of at least one of the metal semiconductor alloy portions 24, and an upper contract portion 34u having a portion that partially extends above an uppermost surface spacer 22 that is located on the vertical sidewalls of the at least one gate structure 20.

At this point of the present disclosure various interconnect levels can be formed atop the structure shown in FIGS. 7A-7B. In some embodiments of the present disclosure, at least one of the interconnect levels can be formed utilizing the processing steps shown in FIGS. 2A-7B of the present disclosure. In such an instance, the photo-patternable dielectric material can be patterned into a sacrificial interconnect structure which can be removed after subsequently forming a planarized inter-level or intra-level interconnect dielectric material, such as a SiCOH-based dielectric. The openings that are formed into the planarized inter-level or intra-level interconnect dielectric material upon removal of the sacrificial interconnect structure can be then filled with a conductive metal-containing material such as Cu.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   at least one gate structure located on a surface of a substrate, wherein metal semiconductor alloy portions are located adjacent to the at least one gate structure; and a middle-of-the-line dielectric material located on at least exposed portions of the substrate and atop the at least one gate stack, wherein the middle-of-the-line dielectric material comprises at least one conductive metal contact that has a bottom contact portion having a bottommost surface in contact with a surface of at least one of the metal semiconductor alloy portions, and an upper contact portion having a portion that partially extends onto and is in direct physical contact with an uppermost surface of a spacer that is present on a vertical sidewall of the at least one gate structure, wherein said upper contact portion has an outermost vertical sidewall surface that is entirely positioned between inner and outer vertical sidewalls of said spacer.

2. The semiconductor structure of claim 1, wherein said gate structure comprises a finFET gate structure.

3. The semiconductor structure of claim 1, wherein said gate structure comprises a semiconductor nanowire gate structure.

4. The semiconductor structure of claim 1, wherein said at least one conductive metal contact comprises a conductive metal-containing material selected from the group consisting of Cu, W and Al.

5. The semiconductor structure of claim 1, wherein said middle-of-the-line dielectric material is selected from the group consisting of silicon dioxide, undoped silicate glass (USG), fluorosilicate glass (FSG), borophosphosilicate glass (BPSG), and a low-k dielectric layer.

6. The semiconductor structure of claim 1, wherein said substrate is a bulk semiconductor substrate or a semiconductor-on-insulator.

7. The semiconductor structure of claim 1, wherein each of said metal semiconductor alloy portions comprises one of Ti, Ni, Pt, W, Co, and Ir.

8. The semiconductor structure of claim 1, wherein said spacer comprises a dielectric insulating material selected from the group consisting of silicon oxide, silicon nitride, silicon oxynitride, boron nitride, and silicon boron nitride.

9. The semiconductor structure of claim 1, wherein said at least one gate structure comprises a material stack of, from bottom to top, a gate dielectric layer portion, and a gate conductor layer portion.

10. The semiconductor structure of claim 9, wherein said material stack further comprises a hard mask material layer portion.

11. The semiconductor structure of claim 1, wherein said upper contact portion does not extend on an uppermost surface of the at least one gate structure.

12. The semiconductor structure of claim 1, wherein said bottom contact portion having sidewalls that are vertically aligned with sidewalls of said metal semiconductor alloy portions.

* * * * *